(12) United States Patent
Shim et al.

(10) Patent No.: US 8,164,494 B2
(45) Date of Patent: Apr. 24, 2012

(54) METHOD AND DEVICE FOR DIGITALLY CORRECTING DC OFFSET

(75) Inventors: Jae Hoon Shim, Daejeon (KR); Hyun Kyu Yu, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 268 days.

(21) Appl. No.: 12/628,186

(22) Filed: Nov. 30, 2009

(65) Prior Publication Data

US 2010/0134334 A1  Jun. 3, 2010

(30) Foreign Application Priority Data

Dec. 2, 2008  (KR) .................. 10-2008-0121254
Jun. 9, 2009  (KR) .................. 10-2009-0050961

(51) Int. Cl.
*H03M 1/06* (2006.01)
(52) U.S. Cl. ..................... 341/118; 375/319
(58) Field of Classification Search .............. 341/118, 341/120; 375/319, 346, 344, 345
See application file for complete search history.

(56) References Cited

U.S. PATENT DOCUMENTS 6,822,679 B1* 11/2004 Kulhalli et al. ............... 348/246
7,835,467 B2* 11/2010 Gupta .......................... 375/319
2005/0275026 A1  12/2005 Tsividis et al.

FOREIGN PATENT DOCUMENTS

EP        1035691 A2      9/2000
JP        2008-099225     4/2008
KR        10-1999-0017139 A  3/1999

* cited by examiner

*Primary Examiner* — Joseph Lauture

(57) ABSTRACT

There is provided a digital Direct Current (DC) offset correction method and device. The device includes a digital-analog converter charging a load capacitor according to an input code value and generating an initial voltage value of the load capacitor; a comparator comparing an output DC offset value of a discrete-time amplifier and filter on the basis of the initial voltage value with a preset output DC offset value when the discrete-time amplifier and filter and the load capacitor are connected to each other; and a controller changing the input code value of the digital-analog converter according to comparison result of the comparator.

14 Claims, 3 Drawing Sheets

METHOD AND DEVICE FOR DIGITALLY CORRECTING DC OFFSET

CROSS-REFERENCE TO RELATED APPLICATIONS

This application claims the priorities of Korean Patent Application Nos. 10-2008-0121254 filed on Dec. 2, 2008 and 10-2009-0050961 filed on Jun. 9, 2009, in the Korean Intellectual Property Office, the disclosures of which are incorporated herein by reference.

BACKGROUND OF THE INVENTION

1. Field of the Invention

The present invention relates to a digital Direct Current (DC) offset correction circuit for obtaining a desired output DC offset value from a discrete-time amplifier and filter, and more particularly, to a digital DC offset correction method and device for enabling the circuit to operate stably by allowing for a uniform output DC offset value, despite variations in process, voltage, and temperature (PVT).

2. Description of the Related Art

Currently, a lot of attention is being paid to analog discrete-time signal processing. This type of signal processing is performed by processing a Radio Frequency (RF) signal in a discrete-time area, in contrast to traditional analog signal processing. In this analog discrete-time signal processing, a signal sampled by using a high speed clock is processed by a combination of a switch and a capacitor. The advantages of analog discrete-time signal processing are the easy control of a signal's input and output characteristics by the reconfiguration of a combination of a clock signal and a capacitor, and suitability for modern deep-submicron processing. However, since a passive element is commonly used, there is a disadvantageous reduction in signal magnitude.

In order to address such a disadvantage, as shown in FIG. 1, U.S. Patent Publication No. 2005/0275026 discloses a method of amplifying a signal using a difference in capacitance between a state in which a metal-oxide-semiconductor field-effect transistor (MOSFET) is inverted (a) and a state in which the MOSFET is not inverted (b).

However, this method may be problematic, in that, since a DC offset as well as a small signal is amplified, the range of an output signal that can be used is somewhat limited.

In order to solve such a problem, as shown in FIG. 2, Japanese Patent Laid-Open Publication No. 2008-099225 discloses a method of solely amplifying a small signal and removing an input DC offset by using two types of capacitors.

This method reduces the DC offset considerably, as compared to the conventional art. However, in the case that the characteristics of the two types of capacitors do not coincide with each other, an output DC offset is changed. Also, according to the capacitance of a load capacitor connected to a circuit, an output DC offset is changed.

SUMMARY OF THE INVENTION

An aspect of the present invention provides a digital Direct Current (DC) offset correction method and device enabling a discrete-time amplifier and filter to set an output DC offset as a desired value irrespective of variations in process, voltage, and temperature (PVT).

According to an aspect of the present invention, there is provided a digital DC offset correction device, the device including: a digital-analog converter charging a load capacitor according to an input code value and generating an initial voltage value of the load capacitor; a comparator comparing an output DC offset value of a discrete-time amplifier and filter on the basis of the initial voltage value with a preset output DC offset value when the discrete-time amplifier and filter and the load capacitor are connected to each other; and a controller changing the input code value of the digital-analog converter according to comparison result of the comparator.

According to another aspect of the present invention, there is provided a digital DC offset correction method, the method including: charging a load capacitor according to an input code value of a digital-analog converter and generating an initial voltage value of the load capacitor; comparing an output DC offset value of the discrete-time amplifier and filter on the basis of the initial voltage value with a preset output DC offset value when the discrete-time amplifier and filter and the load capacitor are connected to each other; and changing the input code value of the digital-analog converter according to the comparison result.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. Moreover, detailed descriptions related to well-known functions or configurations will be ruled out in order not to unnecessarily obscure subject matters of the present invention.

According to exemplary embodiments of the present invention, an output Direct Current (DC) offset value of a discrete-time amplifier and filter may be calibrated by the initial capacitance of a load capacitor CB, and a desired output DC offset value may be obtained by varying an initial voltage value of the load capacitor CB. The initial voltage value of the load capacitor CB is generated by using a Digital-Analog Converter (hereinafter, referred to as "DAC"), and the number of bits of the DAC may be determined according to the accuracy of the output DC offset value.

Figure 1:
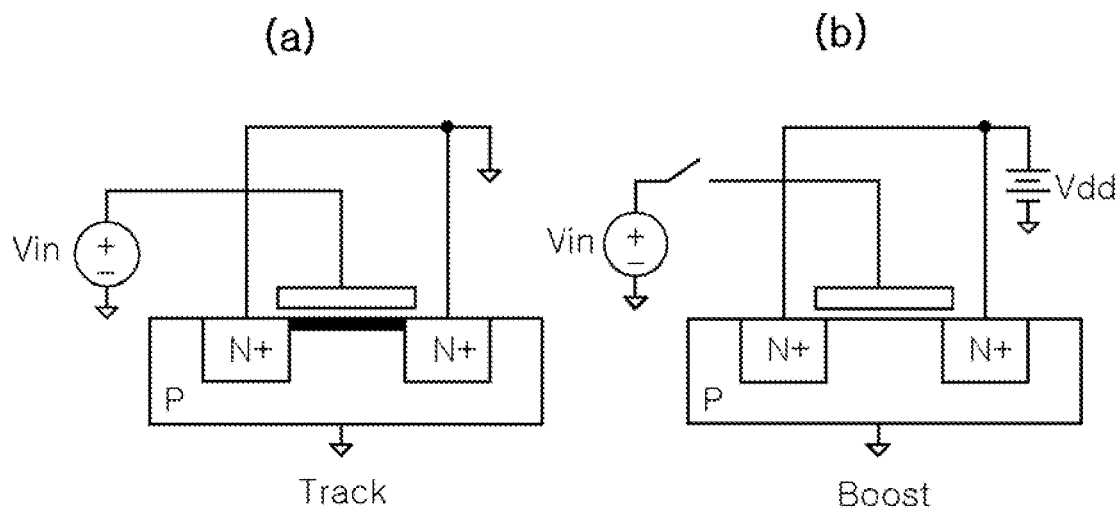
FIG. 1 illustrates a signal amplification method using a difference in capacitance according to the related art.
Figure 2:
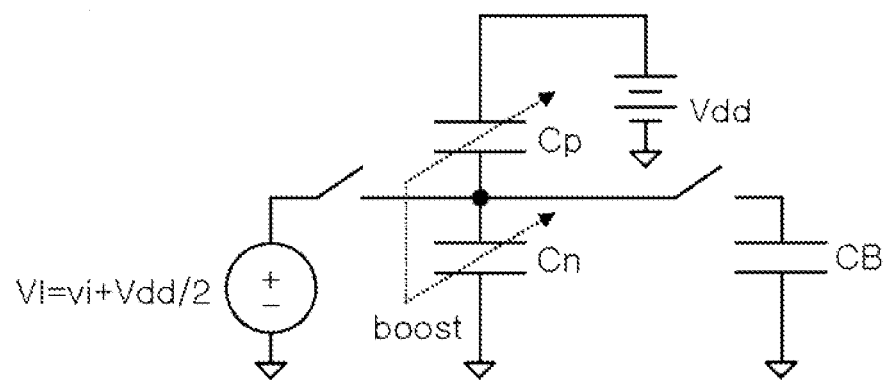
FIG. 2 illustrates a Direct Current (DC) offset removal method using two capacitors according to the related art.
Figure 3:
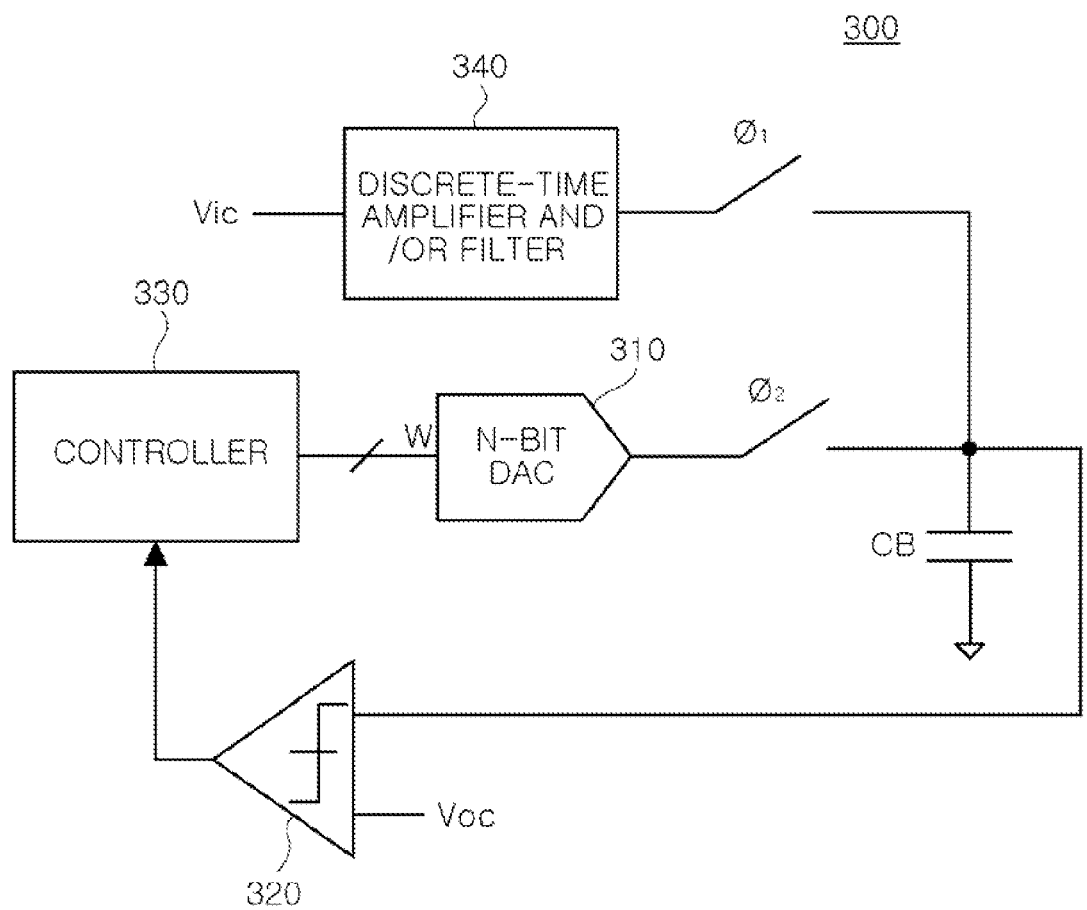
FIG. 3 illustrates a digital DC offset correction device according to an exemplary embodiment of the present invention.

FIG. 3 illustrates a digital DC offset correction device according to an exemplary embodiment of the present invention.

Referring to FIG. 3, a digital DC offset correction device 300 according to this embodiment includes a DAC 310, a comparator 320, and a controller 330.

The DAC 310 and the load capacitor CB are connected to each other (a first switch Φ1 is off and a second switch Φ2 is on) such that the DAC 310 charges the load capacitor CB according to an input code value W and generates an initial voltage value of the load capacitor CB. Concurrently, a desired input DC offset value Vic is applied to a discrete-time amplifier and filter 340.

After generating the initial voltage value of the load capacitor CB, the DAC 310 and the load capacitor CB are separated from each other (the second switch Φ2 is off). The load capacitor CB is connected to the discrete-time amplifier and filter 340 (the first switch Φ1 is on) such that the comparator 320 compares an output DC offset value of the discrete-time amplifier and filter 340 on the basis of the initial voltage value with a preset output DC offset value Voc.

The controller 330 sets an input code value of the DAC 310 in such a manner that a most significant bit (MSB) of the input-code value is set as "1" and the other bit values, except for the MSB, are set as "0". The set input code value is changed, according to the comparison results of the comparator 320. Specifically, the controller 330 maintains the MSB value "1" when the output DC offset value is smaller than the preset output DC offset value, and changes the MSB value to "0" when the output DC offset value is greater than the preset output DC offset value, thereby causing the output DC offset value to be close to the preset output DC offset value. Like this, the controller 330 successively changes each bit value from the MSB to a least significant bit (LSB). Its related descriptions will be presented below with reference to FIG. 4.

The controller 330 may correct an output DC offset value when the discrete-time amplifier and filter 340 is on, and whenever a preset time is periodically reached. Also, the controller 330 may correct an output DC offset value when the configuration of the discrete-time amplifier and filter 340 is changed or when an operation environment such as voltage and temperature is changed.

Also, the digital DC offset correction device 300 may further include a register (not shown) storing pre-calculated input code values of the DAC 310.

Meanwhile, in the case that more accurate DC offset correction is required, the number of bits of the DAC 310 needs to increase. In this case, it may take a long time to perform correction operations. In order to reduce the time taken to do this, the digital DC offset correction device 300 may previously calculate input code values of the DAC 310 according to the configuration of the discrete-time amplifier and filter 340 and store them in a separate register (not shown).

Therefore, the digital DC offset correction device 300 according to this embodiment may obtain a desired output DC offset value without additional correction operations when the configuration of the discrete-time amplifier and filter 340 is changed.

Figure 4:
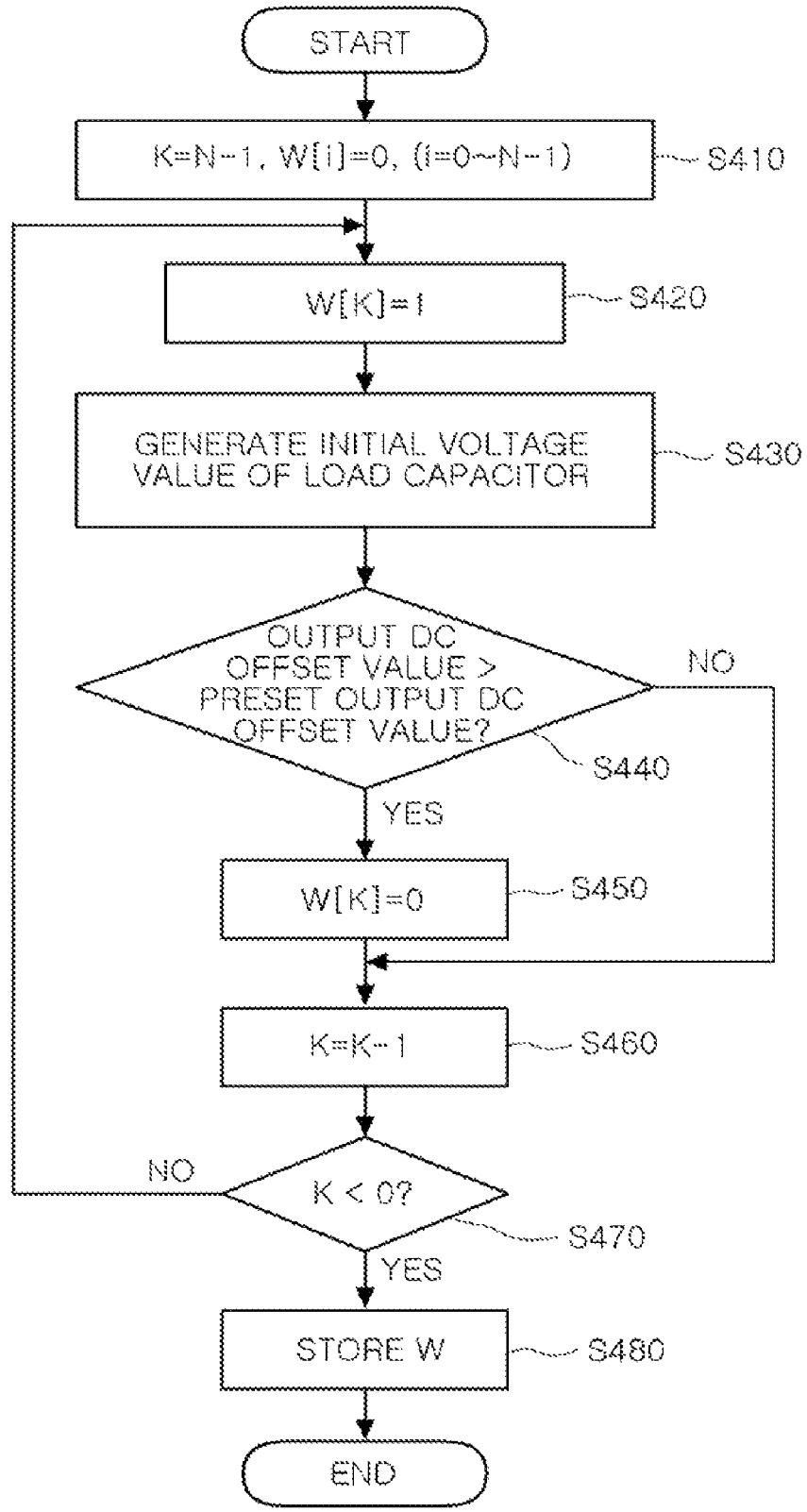
FIG. 4 is a flowchart illustrating a digital DC offset correction method according to another exemplary embodiment of the present invention.

FIG. 4 is a flowchart illustrating a digital DC offset correction method according to another exemplary embodiment of the present invention.

Referring to FIG. 4, the controller 330 sets an input code value W of n-bit DAC 310 in operations S410 and S420. Specifically, the controller 330 sets a total bit value (W[i], i=0, 1, 2, ..., N−1) of an input code as "0" in operation S410, and then sets an MSB value (W[N−1]) of the input code as "1" in operation S420. Here, N is the total number of bits of the input code. That is, the controller 330 sets the MSB value as "1" and the other bit values except for the MSB value as "0".

The DAC 310 and the load capacitor CB are connected to each other (the first switch Φ1 is off and the second switch Φ2 is on) such that the DAC 310 charges the load capacitor CB according to an input code value W and generates an initial voltage value of the load capacitor CB in operation S430. Concurrently, a desired input DC offset value Vic is applied to the discrete-time amplifier and filter 340.

After generating the initial voltage value of the load capacitor CB, the DAC 310 and the load capacitor CB are separated from each other (the second switch Φ2 is off). The load capacitor CB is connected to the discrete-time amplifier and filter 340 (the first switch Φ1 is on) such that the comparator 320 compares an output DC offset value of the discrete-time amplifier and filter 340 on the basis of the initial voltage value with a desired output DC offset value Voc, i.e., a preset output DC offset value. Specifically, the comparator 320 determines whether the output DC offset value is greater than the preset output DC offset value Voc in operation S440.

Since the output DC offset value of the discrete-time amplifier and filter 340 according to this invention may be calibrated by the initial capacitance of the load capacitor CB, the desired output DC offset value may be obtained by varying the initial capacitance of the load capacitor CB.

Then, the controller 330 changes the MSB value W[K] of the input code from "1" to "0" when the output DC offset value is greater than the preset output DC offset value Voc in operation S450, and maintains the MSB value W[K] of the input code as "1" when the output DC offset value is smaller than the preset output DC offset value Voc.

Meanwhile, when the MSB value W[K] of the input code is set as "1" in operation S420 and the comparison result in operation S440 is "YES," the MSB value W[K] of the input code is changed to "0". However, when the comparison result in operation S440 is "NO," there is no need to perform operation S450, and thus the process proceeds to operation S460.

Then, the controller 330 subtracts 1 from an index value K so as to determine the next bit value subsequent to the MSB in operation S460, and determines whether the index value K is a negative number in operation S470.

When the index value K in operation S470 is not a negative number, operations S420 to S470 are repeatedly performed in such a manner that each bit value of the input code from the MSB to the LSB is successively changed until the output DC offset value is close to the preset output DC offset value Voc.

For example, when the input code value is "abcde," the bit value of the MSB "a" is determined by comparing the output DC offset value with the preset output DC offset value Voc, and then the bit values of "b," "c," "d," and "e" are successively determined by repeatedly performing operations S920 to S470. That is, when the output DC offset value is greater than the preset output DC offset value Voc, the input code value becomes "0bcde." With respect to the bit "b," subsequent to "a," when the output DC offset value is greater than the preset output DC offset value Voc, the input code value becomes "00cde." With respect to the bit "c," subsequent to "b", when the output DC offset value is smaller than the preset output DC offset value Voc, the input code value becomes "001de." Through these operations, the output DC offset value of the discrete-time amplifier and filter 340 becomes a desired value Voc by using a binary search in such a manner that each bit value of the input code is successively determined from the MSB to the LSB.

When the index value K in operation 5470 is a negative number, all bit values of the input code of the DAC 310 are determined, so the controller 330 stores the finally determined input code value in a separate register in operation S480.

Therefore, the digital DC offset correction device 300 according to this embodiment may obtain the desired output DC offset value using the input code value stored in the separate register without correction operations when the configuration of the discrete-time amplifier and filter 340 is changed.

As set forth above, according to exemplary embodiments of the invention, there is provided the digital DC offset correction method and device allowing for uniformly maintaining the output DC offset value of the discrete-time amplifier and filter by varying the input code value of the DAC. Therefore, the discrete-time amplifier and filter may be configured to include several discrete-time amplifiers and filters that are connected to each other, thereby improving the linearity of the circuit and enabling the circuit to operate stably.

While the present invention has been shown and described in connection with the exemplary embodiments, it will be apparent to those skilled in the art that modifications and variations can be made without departing from the spirit and scope of the invention as defined by the appended claims.

What is claimed is:

1. A digital Direct Current (DC) offset correction device comprising:
    a digital-analog converter configured to charge a load capacitor according to an input code value and to generate an initial voltage value of the load capacitor;
    a comparator configured to compare an output DC offset value of a discrete-time amplifier and filter determined on the basis of the initial voltage value with a preset output DC offset value when the discrete-time amplifier and filter is coupled to the load capacitor; and
    a controller configured to change the input code value of the digital-analog converter according to the comparison result of the comparator.

2. The digital DC offset correction device of claim 1, wherein the controller is configured to change the input code value of the digital-analog converter until the output DC offset value is close to the preset output DC offset value.

3. The digital DC offset correction device of claim 1, wherein the controller is configured to change the input code value of the digital-analog converter by successively changing each bit value of the input code value of the digital-analog converter from a most significant bit to a least significant bit by using a binary search.

4. The digital DC offset correction device of claim 1, wherein the controller is configured to correct the output DC offset value according to a preset period.

5. The digital DC offset correction device of claim 1, further comprising a register configured to store an input code value of the digital-analog converter, previously calculated by the digital DC offset correction device according to configuration of the discrete-time amplifier and filter.

6. The digital DC offset correction device of claim 1, wherein the controller is configured to correct the output DC offset value when the configuration of the discrete-time amplifier and filter changes or when an operation environment changes.

7. The digital DC offset correction device of claim 1, wherein the digital-analog converter and the discrete-time amplifier and filter are alternately coupled to the load capacitor.

8. The digital DC offset correction device of claim 1, wherein the comparator is configured to determine whether or not the output DC offset value is greater than the preset output DC offset value.

9. A digital Direct Current (DC) offset correction method comprising:
    charging a load capacitor according to an input code value of a digital-analog converter and generating an initial voltage value of the load capacitor;
    comparing an output DC offset value of a discrete-time amplifier and filter on the basis of the initial voltage value with a preset output DC offset value when the discrete-time amplifier filter is coupled to the load capacitor; and
    changing the input code value of the digital-analog converter according to the comparison result.

10. The digital DC offset correction method of claim 9, wherein the input code value of the digital-analog converter is changed until the output DC offset value is close to the preset output DC offset value by repeatedly and successively changing each bit value of the input code value of the digital-analog converter from a most significant bit to a least significant bit by using a binary search.

11. The digital DC offset correction method of claim 9, further comprising storing the changed input code value of the digital-analog converter.

12. The digital DC offset correction method of claim 9, wherein the output DC offset value is corrected when the configuration of the discrete-time amplifier and filter changes or when an operation environment changes.

13. The digital DC offset correction method of claim 9, wherein the digital-analog converter and the discrete-time amplifier and filter are alternately coupled to the load capacitor.

14. The digital DC offset correction method of claim 9, wherein the comparing step comprises determining whether or not the output DC offset value is greater than the preset output DC offset value.

* * * * *